US008508392B2

(12) United States Patent
Nam et al.

(10) Patent No.: US 8,508,392 B2
(45) Date of Patent: Aug. 13, 2013

(54) PIPELINED ANALOG DIGITAL CONVERTER

(75) Inventors: Jaewon Nam, Daejeon (KR); Young-deuk Jeon, Daejeon (KR); Young Kyun Cho, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 53 days.

(21) Appl. No.: 13/243,629

(22) Filed: Sep. 23, 2011

(65) Prior Publication Data

US 2012/0146820 A1 Jun. 14, 2012

(30) Foreign Application Priority Data

Dec. 9, 2010 (KR) ........................ 10-2010-0125773

(51) Int. Cl.
*H03M 1/06* (2006.01)

(52) U.S. Cl.
USPC ............................ 341/118; 341/161; 341/162

(58) Field of Classification Search
USPC .......................................... 341/118, 161, 162
See application file for complete search history.

(56) References Cited

U.S. PATENT DOCUMENTS 5,274,377 A * 12/1993 Matsuura et al. ............. 341/161
6,337,651 B1 * 1/2002 Chiang ......................... 341/161
6,825,783 B2 11/2004 You
6,861,969 B1 * 3/2005 Ali ................................ 341/161

FOREIGN PATENT DOCUMENTS

KR 10-2010-0080391 A 7/2010

OTHER PUBLICATIONS

Lane Brooks et al., "Background Calibration of Pipelined ADCs Via Decision Boundary Gap Estimation", IEEE Transactions on Circuits and Systems—I: Regular Papers, Nov. 10, 2008, pp. 2969-2979, vol. 55, No. 10.

Un-Ku Moon et al., "Background Digital Calibration Techniques for Pipelined ADC's", IEEE Transactions on Circuits and Systems—II: Analogy and Digital Signal Processing, Feb. 2, 1997, pp. 102-109, vol. 44, No. 2.

* cited by examiner

*Primary Examiner* — Khai M Nguyen

(57) ABSTRACT

Disclosed is a pipelined analog-to-digital converter which includes a digital correction circuit configured to measure and correct a pipelined conversion stage gain error and an offset error due to a finite voltage gain operational amplifier and capacitor mismatch. The pipelined analog-to-digital converter includes a pipelined conversion stage error measuring and correcting circuit measuring and correcting an error generated from an conversion stage, so that an error of a conversion stage is minimized and a chip realization area and power consumption are reduced.

15 Claims, 10 Drawing Sheets

PIPELINED ANALOG DIGITAL CONVERTER

CROSS-REFERENCE TO RELATED APPLICATIONS

This application claims the benefits, under 35 U.S.C §119, of Korean Patent Application No. 10-2010-0125773 filed Dec. 9, 2010, the entirety of which is incorporated by reference herein.

BACKGROUND

Exemplary embodiments relate to a pipelined analog-to-digital converter.

An image system such as HDTV may necessitate an high-performance analog-to-digital converter (hereinafter, referred to as ADC) which provides a high resolution of 10 bits to 12 bits and a high sampling speed of some hundreds MHz. Among various ADC structures, a pipeline structure may have been used to satisfy high-speed signal processing and high-resolution conditions.

In case of a typical pipelined ADC, conversion stage offset and gain error of a conversion stage may be caused due to a conversion stage having capacitor mismatch and an insufficient DC voltage gain characteristic of an operational amplifier. To solve such problems, the typical pipelined ADC may cause power consumption of an operational amplifier, an increase in a realization area, and an increase in an area of a capacitor.

SUMMARY

A pipelined analog-to-digital converter is provided to correct conversion stage offset and a gain error of a conversion stage and to minimize a realization area.

One aspect of embodiments of the inventive concept is directed to provide a pipelined analog-to-digital converter which comprises a conversion stage part including K conversion stages (K being an integer of 2 or more) connected in series, each of the K conversion stages being configured to convert an input voltage into a B-bit digital code (B being a natural number) in response to a plurality of clock signals and to output a residual voltage, the K conversion stages being divided into an upper conversion part having a conversion stage being an error-measured object and a lower conversion part having at least one conversion stage connected in series with the upper conversion part; a first digital correction circuit configured to receive at least one digital code from the lower conversion part and to perform a data correction operation; a pipelined conversion stage error measuring and correcting circuit configured to measure an error of the upper conversion part and to correct an output value from the first digital correction circuit using the measured error; and a second digital correction circuit configured to receive at least one digital code from the upper conversion part and an output value of the pipelined conversion stage error measuring and correcting circuit and to make a data correction operation.

In this embodiment, each of the K conversion stages comprises a multiplying digital-to-analog converter configured to convert a $(2^B-1)$-bit digital code into an analog signal in response to the plurality of clock signals and to output the residual voltage by subtracting the converted analog signal from the input voltage; and an analog-to-digital sub-converter configured to convert the input voltage into the $(2^B-1)$-bit digital code and the B-bit digital code.

In this embodiment, the multiplying digital-to-analog converter comprises a sampler configured to sample the input voltage in response to a first clock signal of the plurality of clock signals; a digital-to-analog converter configured to convert the $(2^B-1)$-bit digital code into an analog signal in response to a second clock signal of the plurality of clock signals; a subtracter configured to subtract an output value of the digital-to-analog converter from an output of the sampler; and a residual voltage amplifier configured to output the residual voltage by amplifying an output value of the subtracter in response to the second clock signal.

In this embodiment, the analog-to-digital sub-converter comprises a sampler configured to sample the input voltage in response to a first clock signal of the plurality of clock signals; a preprocessing amplifier string configured to amplify an output value of the sampler; a latch string configured to latch an output value of the preprocessing amplifier string in response to a second clock signal of the plurality of clock signals and to output the $(2^B-1)$-bit digital code; and a decoder configured to decode an output value of the latch string into the B-bit digital code.

In this embodiment, the multiplying digital-to-analog converter comprises an operational amplifier configured to output the residual voltage; at least one first switch configured to sample an input signal in response to a first clock signal of the plurality of clock signals and a clock signal having a changed phase of the first clock signal, to convert the $(2^B-1)$-bit digital code from the analog-to-digital sub-converter into an analog signal in response to a second clock signal of the plurality of clock signals, and to output the converted analog signal to an input terminal of the operational amplifier; and at least one second switch configured to sample the input signal in response to the first clock signal and the clock signal having a changed phase of the first clock signal and to connect the input terminal and an output terminal of the operation amplifier in response to the second clock signal.

In this embodiment, the first and second clock signals are complementary.

In this embodiment, the pipelined conversion stage error measuring and correcting circuit comprises a conversion stage error measuring circuit configured to measure an offset and a gain of a first one of the K conversion stages; and a conversion stage error correcting circuit configured to correct an output value of the first digital correction circuit using the measured offset and gain.

In this embodiment, the conversion stage error measuring circuit comprises a first register; a second register; a first digital comparator configured to compare an output value of the first digital correction circuit with a value stored in the first register; a second digital comparator configured to compare the output value of the first digital correction circuit with a value stored in the second register; a first update decoder configured to update the value stored in the first register with the output value of the first digital correction circuit when a comparison result of the first digital comparator indicates that the output value of the first digital correction circuit is larger than the value stored in the first register; and a second update decoder configured to update the value stored in the second register with the output value of the first digital correction circuit when a comparison result of the second digital comparator indicates that the output value of the second digital correction circuit is smaller than the value stored in the second register.

In this embodiment, the first and second registers are reset in response to a present signal.

In this embodiment, the conversion stage error correcting circuit comprises an offset remover configured to remove the offset in response to values stored in the first and second registers; a conversion stage gain corrector configured to correct the gain in response to the values stored in the first and second registers and an output value of the offset remover; and an offset corrector configured to correct the offset in response to an output value of the conversion stage gain corrector.

In this embodiment, the offset remover outputs an offset of:

$|(2\times D_{RAW}-D_{CODE})/2|$, wherein $D_{RAW}$ is an output value of the first digital correction circuit, $D_{CODE}$ is a sum of a value stored in the first register and a value stored in the second register.

In this embodiment, the conversion stage gain corrector multiplies an output value of the offset remover with a value of:

$[D_{G,ideal}/D_{G,real}]=[2^{M-1}/(D_{MAX}-D_{MIN}+1)]$, wherein $D_{G,ideal}$ indicates an ideal measurement period, $D_{G,real}$ indicates a real measurement period, M indicates the number of digital bits output from the first digital correction circuit, $D_{MAX}$ is a value stored in the first register, and $D_{MIN}$ is a value stored in the second register.

In this embodiment, the offset corrector adds an output value of the conversion stage gain corrector and a value of:

$D_{OS,ideal}=[2^{M-2}]$, wherein $D_{OS,ideal}$ is an ideal offset digital code value.

In this embodiment, the pipelined analog-to-digital converter further comprises a clock signal generator configured to generate the plurality of clock signal.

In this embodiment, the pipelined analog-to-digital converter further comprises a reference voltage buffer configured to generate a reference voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
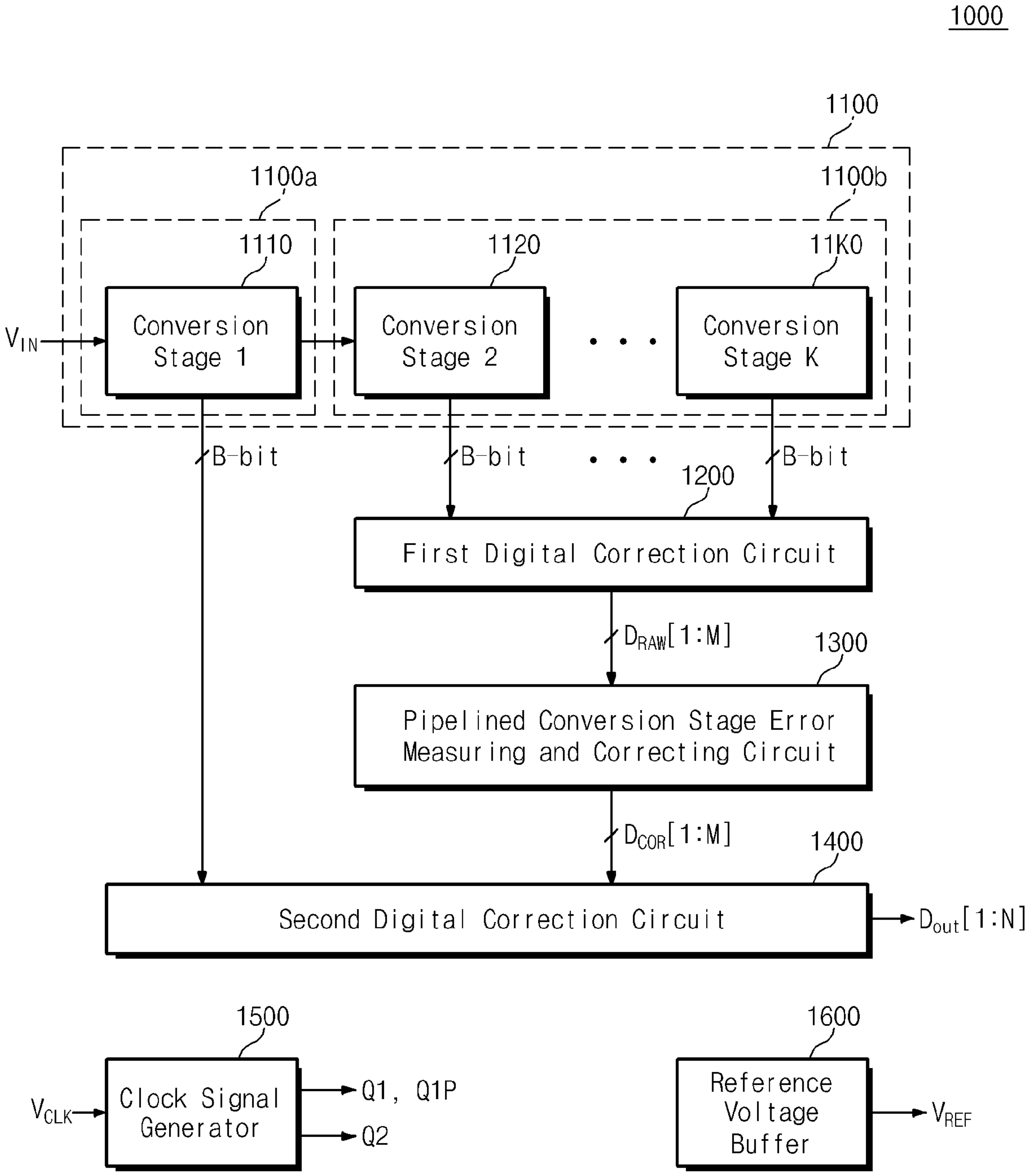
FIG. 1 is a block diagram illustrating a pipelined analog-to-digital converter according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a pipelined analog-to-digital converter according to an exemplary embodiment of the inventive concept. Referring to FIG. 1, a pipelined analog-to-digital converter (ADC) may include a conversion stage circuit 1100, the first digital correction circuit 1200, a pipelined conversion stage error measuring and correcting circuit 1300, the second digital correction circuit 1400, a clock signal generator 1500, and a reference voltage buffer 1600.

The conversion stage circuit 1100 may include an upper conversion part 1100*a* and a lower conversion part 1100*b*. The upper conversion part 1100*a* may include a conversion stage 1110 which is configured to convert an input signal $V_{IN}$ into a B-bit digital code and to output a residual voltage. Herein, the input signal $V_{IN}$ may be an analog signal, and 'B' may be a natural number. In FIG. 1, there is exemplarily illustrated the case that the upper conversion part 1100*a* includes a conversion stage 1110. However, the inventive concept is not limited thereto. The upper conversion part 1100*a* may include a conversion stage whose offset and gain error are to be measured.

The lower conversion part 1100*b* may be connected with the upper conversion part 1100*a*, that is, the conversion stage 1110, and may include a plurality of conversion stages 1120 to 11K0 (K being an integer more than 2) connected in series. Herein, in response to at least one clock signal (e.g., Q1, Q1P, or Q2), each of the conversion stages 1120 to 11K0 may be configured to convert a residual voltage output from a previous conversion stage into a B-bit digital code and to output a residual voltage to a next conversion stage. In FIG. 1, there is exemplarily illustrated the case that the lower conversion part 1100*b* includes the conversion stages 1120 to 11K0. However, the inventive concept is not limited thereto. The lower conversion part 1100*b* may include at least one conversion stage connected in series with the upper conversion part 1100*a*.

The conversion stages 1110 to 11K0 may be configured the same as one another.

The first digital correction circuit 1200 may make a logic correction operation on digital codes provided from the lower conversion part 1100*b*, that is, the conversion stages 1120 to 11K0 to output a corrected M-bit digital code $D_{RAW}$ (M being a natural number). Herein, the logic correction operation may include correcting offset voltages of plural comparators (not shown) of an analog-to-digital converter (not shown) included in a conversion stage. The digital code $D_{RAW}$ may be a value obtained by converting a residual voltage of the conversion stage 1110 into a digital code and may include an error component of the conversion stage 1110.

The pipelined conversion stage error measuring and correcting circuit 1300 may be configured to receive the digital code $D_{RAW}$ from the first digital correction circuit 1200, to measure and extract gain and offset errors of a conversion stage, and to correct the extracted error. The pipelined conversion stage error measuring and correcting circuit 1300 may output a corrected M-bit digital code $D_{COR}$.

The second digital correction circuit 1400 may be configured to receive the B-bit digital code from the conversion stage 1110 and the M-bit digital code $D_{COR}$ from the pipelined conversion stage error measuring and correcting circuit 1300, to perform a logic correction operation, and to output an N-bit digital code Dout (N being a natural number).

The clock signal generator 1500 may generate clock signals (e.g., Q1, Q1P, Q2) for a digital conversion operation in response to a clock voltage $V_{CLK}$.

The reference voltage buffer 1600 may generate a reference voltage $V_{REF}$ for a digital conversion operation.

The pipelined ADC 1000 according to an exemplary embodiment of the inventive concept may be configured to self-measure an offset of the conversion stage 1110 and a conversion stage gain error and to correct digital codes from the conversion stages 1120 to 11K0 using the measured offset and conversion stage gain error.

The pipelined ADC 1000 in FIG. 1 may be configured to correct a conversion stage gain error of the conversion stage 1110. However, the inventive concept is not limited thereto. It is possible to correct a conversion stage gain error of the conversion stage 1120 in the same manner that a conversion stage gain error of the conversion stage 1110 is corrected. Likewise, it is possible to correct conversion stage gain errors of remaining conversion stages 1130 to 11K0 using the same manner that a conversion stage gain error of the conversion stage 1110 is corrected. The pipelined ADC 1000 according to an exemplary embodiment of the inventive concept may recursively correct a gain error of each of all conversion stages by providing a digital correction circuit in this order of the conversion stages 11K0 to 1110.

In case of a typical pipelined ADC, offset and gain error of a conversion stage may be caused due to a conversion stage having capacitor mismatch and an insufficient DC voltage gain characteristic of an operational amplifier. To solve such problems, the typical pipelined ADC may cause power consumption of an operational amplifier, an increase in a realization area, and an increase in an area of a capacitor.

The pipelined ADC 1000 according to an exemplary embodiment of the inventive concept may minimize a realization area and power consumption by self-measuring an offset of the upper conversion part 1100*a* (e.g., the conversion stage 1110) and a conversion stage gain error and correcting digital codes from the lower conversion part 1100*b* (e.g., the conversion stages 1120 to 11K0) using the measured offset and conversion stage gain error.

Figure 2:
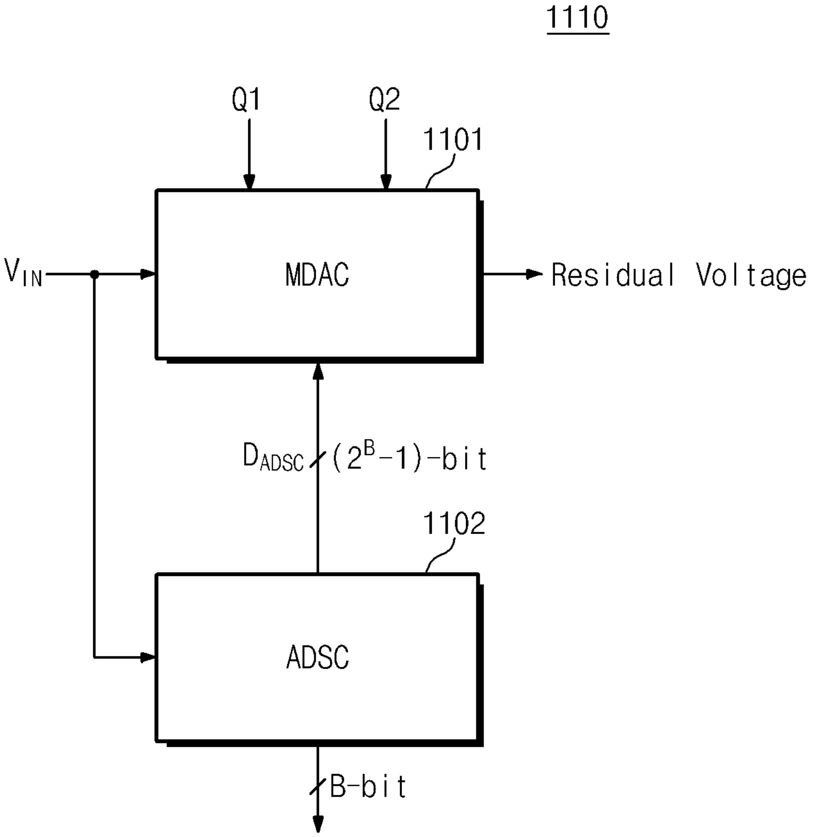
FIG. 2 is a block diagram illustrating a first conversion stage in FIG. 1.

FIG. 2 is a block diagram illustrating a first conversion stage in FIG. 1. Referring to FIG. 2, the first conversion stage 1110 may include a multiplying digital-to-analog converter (MDAC) 1101 and an analog-to-digital sub-converter (ADSC) 1102.

The MDAC 1101 may convert a ($2^B-1$)-bit digital code $D_{ADSC}$ into an analog signal in response to clock signals Q1 and Q2 and may output a residual voltage $V_{RES}$ by subtracting the converted analog signal from an input signal $V_{IN}$.

The ADSC 1102 may convert the input signal $V_{IN}$ into a B-bit digital code and the ($2^B-1$)-bit digital code $D_{ADSC}$.

Figure 3:
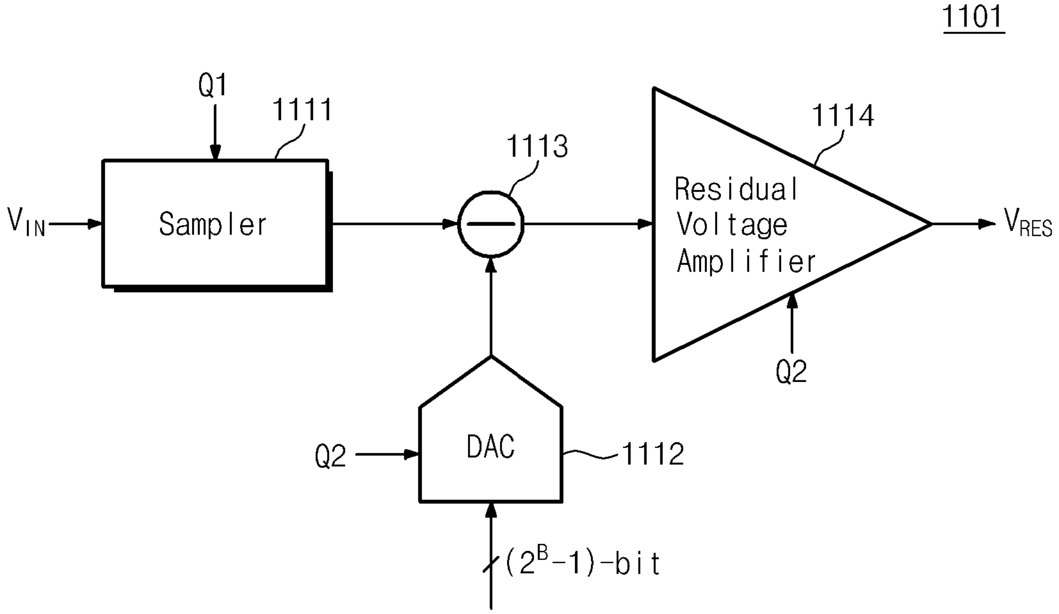
FIG. 3 is a block diagram illustrating a multiplying digital-to-analog converter in FIG. 2.

FIG. 3 is a block diagram illustrating a multiplying digital-to-analog converter in FIG. 2. Referring to FIG. 3, a multiplying digital-to-analog converter 1101 may include a sampler 1111, a digital-to-analog converter (DAC) 1112, a subtractor 1113, and a residual voltage amplifier 1114.

The sampler 1111 may be configured to sample an input signal $V_{IN}$ in response to the first clock signal Q1.

The DAC 1112 may be configured to convert a ($2^B-1$)-bit digital code into an analog signal in response to the second clock signal Q2.

The subtractor 1113 may be configured to subtract an output value of the DAC 1112 from an output value of the sampler 111.

The residual voltage amplifier 1114 may be configured to amplify an output value of the subtractor 1113 in response to the second clock signal Q2. An output signal of the residual voltage amplifier 1114 may be a residual voltage $V_{RES}$.

Figure 4:
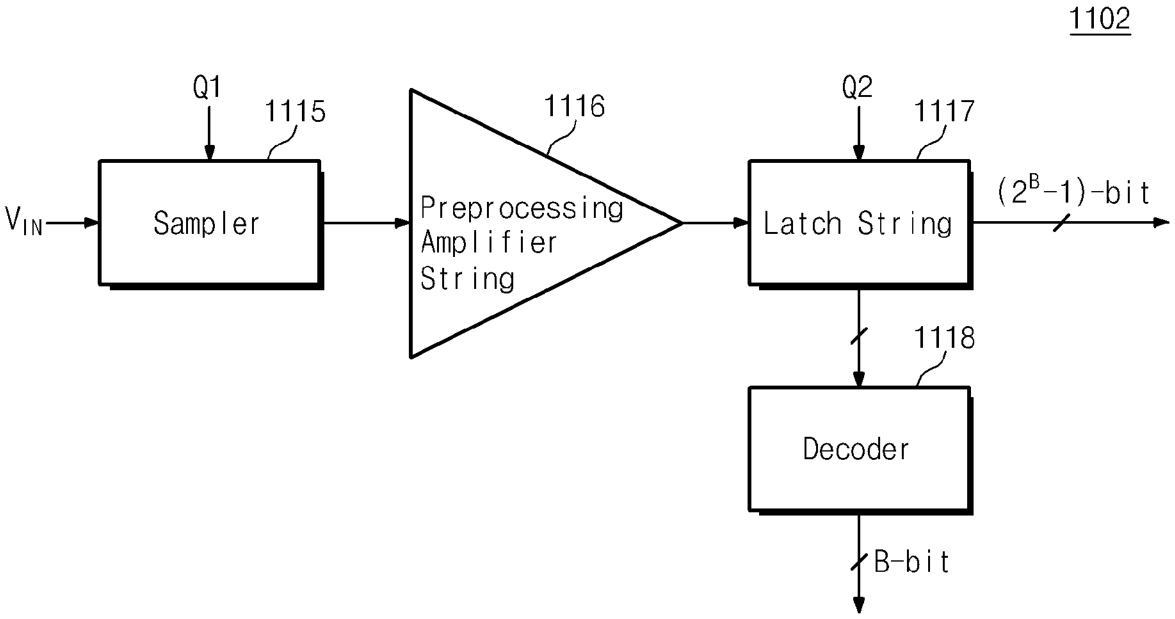
FIG. 4 is a block diagram illustrating a digital-to-analog sub-converter in FIG. 2.

FIG. 4 is a block diagram illustrating a digital-to-analog sub-converter in FIG. 2. Referring to FIG. 4, a digital-to-analog sub-converter 1102 may include a sampler 1115, a preprocessing amplifier string 1116, a latch string 1117, and a decoder 1118.

The sampler 1115 may be configured to sample an input signal $V_{IN}$ in response to the first clock Q1.

The preprocessing amplifier string 1116 may be configured to amplify an output value of the sampler 1115.

The latch string 1117 may be configured to output a $(2^B-1)$-bit digital code by latching an output value of the preprocessing amplifier string 1116 in response to the second clock signal Q2.

The decoder 1118 may be configured to output a B-bit digital code by decoding an output value of the latch string 1117.

Figure 5:
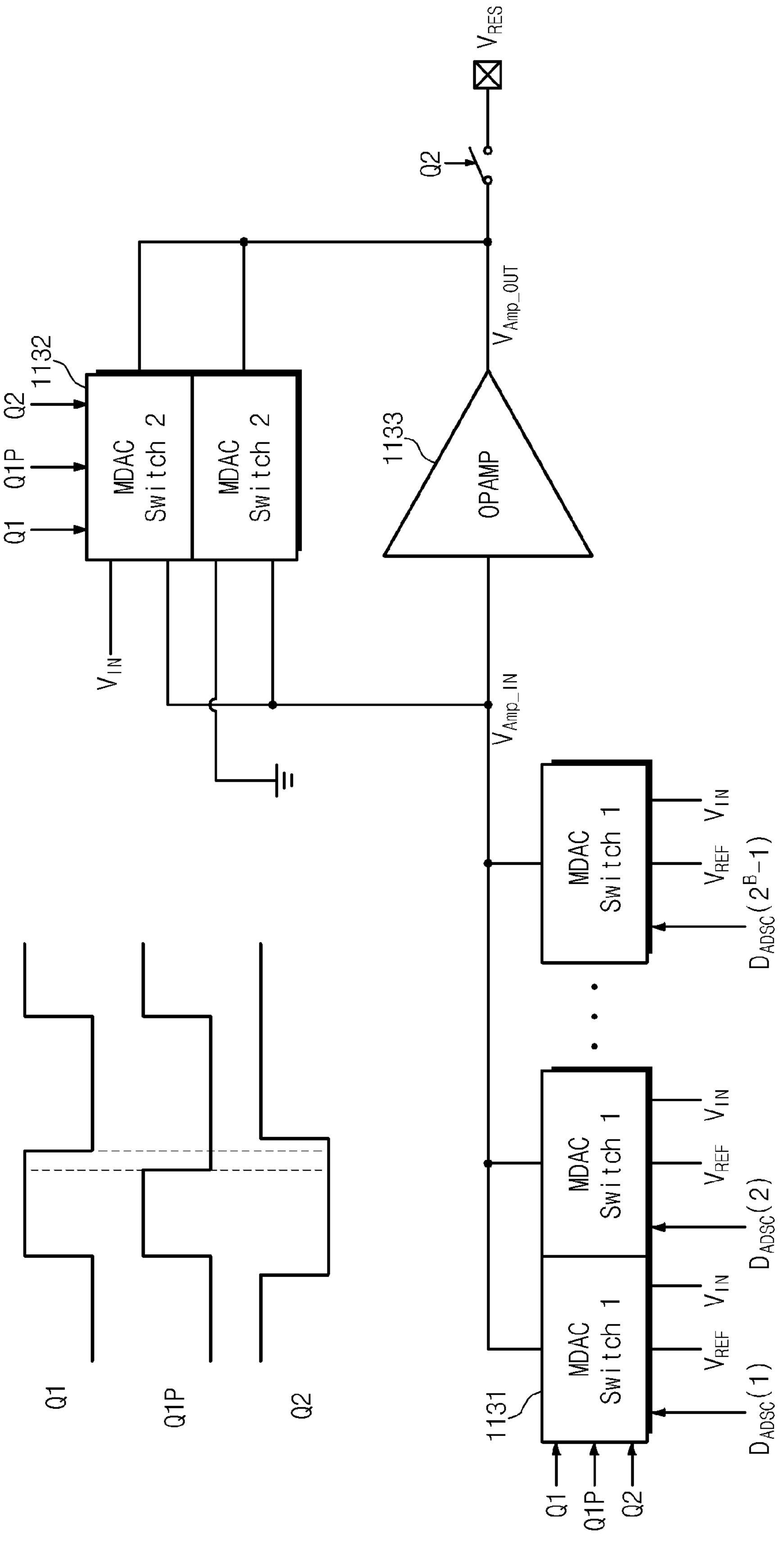
FIG. 5 is a block diagram illustrating a multiplying analog-to-digital converter (MDAC) in FIG. 3.

FIG. 5 is a block diagram illustrating a multiplying analog-to-digital converter (MDAC) in FIG. 3. Referring to FIG. 5, a multiplying analog-to-digital converter may include the first MDAC switches 1131 each performing a sampling operation and a digital-to-analog conversion operation, the second MDAC switches 1132 each performing a sampling operation and a residual voltage amplifying operation, and an operational amplifier 1133 used at a current-voltage amplifying operation.

Each of the first MDAC switches 1131 may receive a digital code $D_{ADSCi}$ (i being one of 1, 2, . . . , $(2^B-1)$), a reference voltage $V_{REF}$, and an input signal $V_{IN}$ in response to clock signals Q1, Q1P, and Q2 to perform a digital-to-analog conversion operation and may then generate an amplifier input signal $V_{Amp\_IN}$. In particular, each of the first MDAC switches 1131 may sample the input signal $V_{IN}$ in response to the first clock Q1 and a clock signal Q1P having a changed phase of the first clock signal Q1, convert the (2B−1)-bit digital code $D_{ADSCi}$ output from an analog-to-digital converter 1102 (refer to FIG. 2) into an analog signal in response to the second clock Q2, and output the converted analog signal into an input terminal of the operation amplifier 1133.

Each of the second MDAC switches 1132 may receive the amplifier input signal $V_{Amp\_IN}$ and the input signal $V_{IN}$ in response to the clock signals Q1, Q1P, and Q2 to perform a residual voltage amplifying operation and may then generate an amplifier output signal $V_{Amp\_OUT}$. In particular, each of the second MDAC switches 1132 may sample the input single $V_{IN}$ in response to the first clock Q1 and a clock signal Q1P having a changed phase of the first clock signal Q1 and connect an input terminal and an output terminal of the operational amplifier 1133 in response to the second clock signal Q2.

The operation amplifier 1133 may receive the amplifier input signal $V_{Amp\_IN}$ to output the amplifier output signal $V_{Amp\_OUT}$. Herein, the output signal of the operation amplifier 1133 may be a residual voltage of a conversion stage.

The MADC 1102 according to an exemplary embodiment of the inventive concept may be configured to sample the input signal $V_{IN}$ in response to a clock signal Q1 and to perform a digital-to-analog conversion operation and a residual voltage amplifying operation in response to the clock signal Q2.

Figure 6:
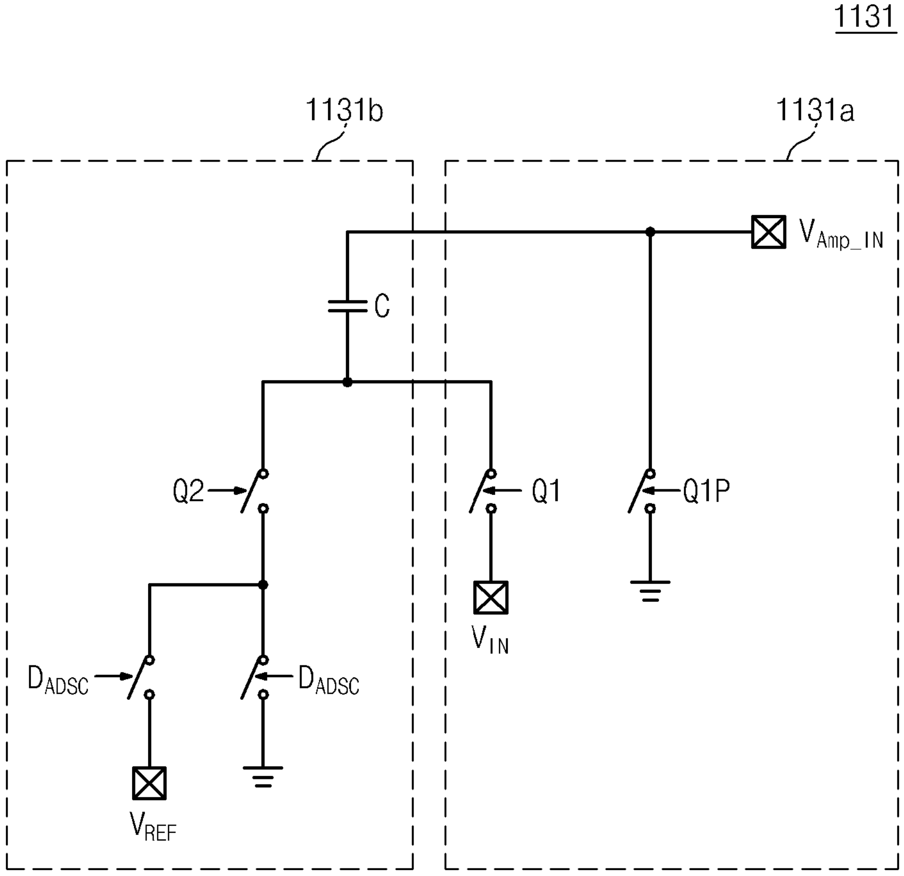
FIG. 6 is a diagram illustrating the first MDAC switch in FIG. 5 according to an exemplary embodiment of the inventive concept.

FIG. 6 is a diagram illustrating the first MDAC switch in FIG. 5 according to an exemplary embodiment of the inventive concept. Referring to FIG. 6, the first MDAC switch 1131 may include a sampler 1131*a* and a digital-to-analog converter 1131*b*.

The sampler 1131*a* may sample an input signal $V_{IN}$ in response to clock signals Q1 and Q1P.

The digital-to-analog converter 1131*b* may convert a digital code $D_{ADSCi}$ from an analog-to-digital sub-converter 1102 into an analog value in response to a clock signal Q2.

Figure 7:
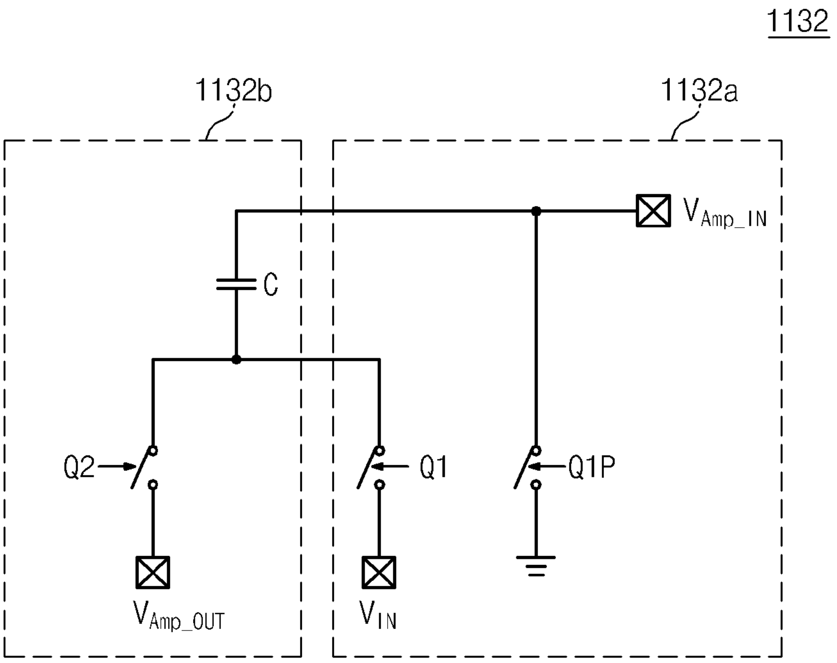
FIG. 7 is a diagram illustrating the second MDAC switch in FIG. 5 according to an exemplary embodiment of the inventive concept.

FIG. 7 is a diagram illustrating the second MDAC switch in FIG. 5 according to an exemplary embodiment of the inventive concept. Referring to FIG. 7, the second MDAC switch 1132 may include a sampler 1132*a* and a residual voltage amplifier 1132*b*.

The sampler 1132*a* may sample an input signal $V_{IN}$ in response to clock signals Q1 and Q1P.

The residual voltage amplifier 1132*b* may output a residual voltage of a conversion stage by feeding an output value of an operational amplifier 1133 in FIG. 5 back to its input terminal in response to a clock signal Q2.

Figure 8:
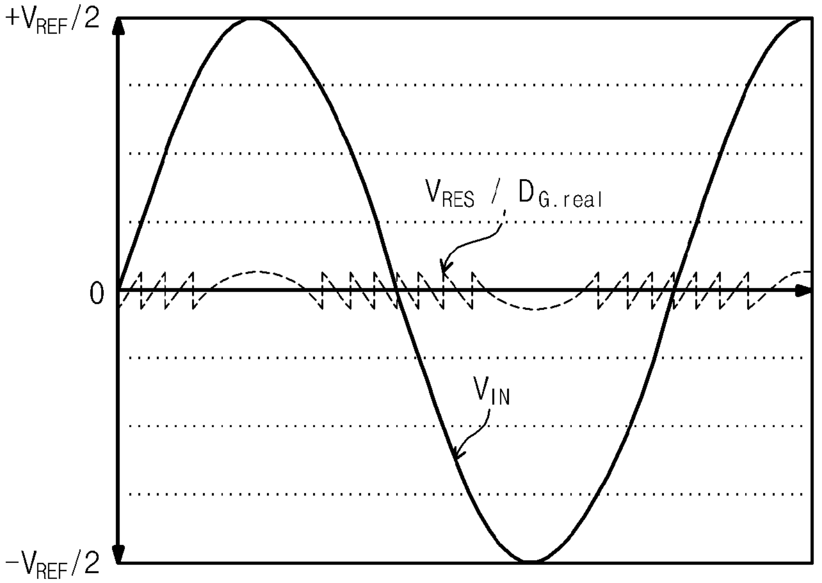
FIGS. 8 and 9 are diagrams for describing a conversion stage offset and a conversion gain variation.
Figure 9:
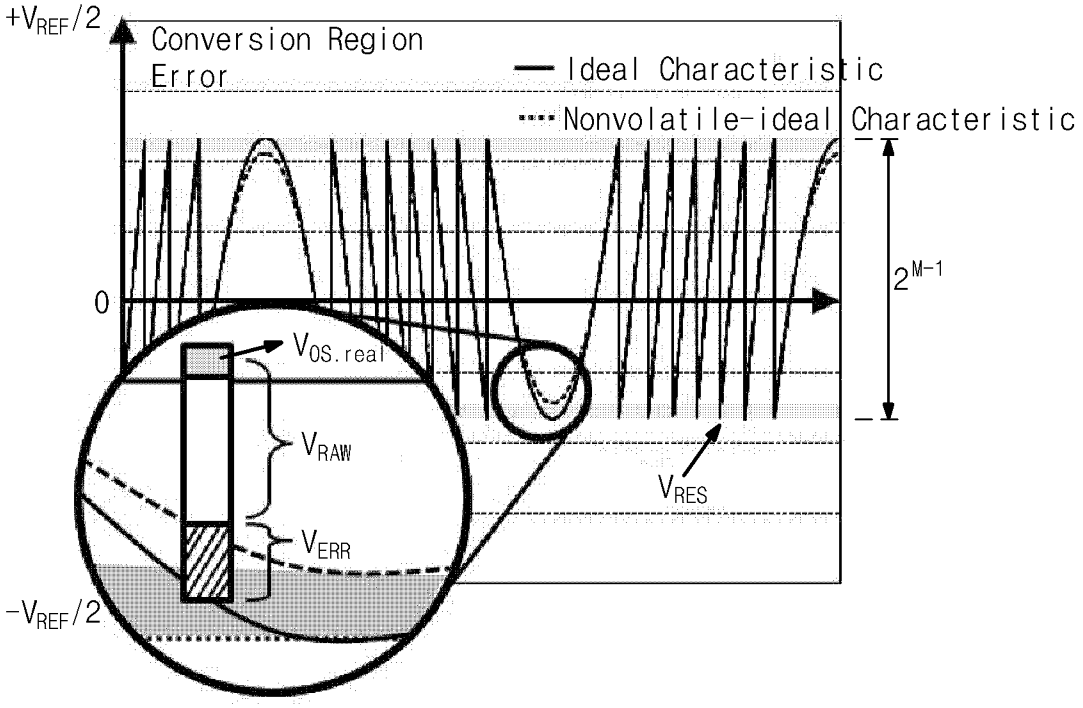

FIGS. 8 and 9 are diagrams for describing a conversion stage offset and a conversion gain variation.

As illustrated in FIG. 2, if an input signal $V_{IN}$ is applied to a conversion stage 1110 in FIG. 1, a signal may be modulated to have such a pattern that $(2^B-1)$ comparison periods are fold, according to a digital-to-analog conversion operation (refer to FIG. 6) of an digital-to-analog sub-converter 1102. With this modulation manner, as illustrated in FIG. 8, a residual voltage $V_{RES}$ may include an offset $V_{OS,real}$ and a conversion stage gain error $V_{ERR}$ according to a conversion stage gain. Herein, the residual voltage $V_{RES}$ may be converted into an M-bit digital code $D_{RAW}$ by a lower conversion part 1100*b* in FIG. 1. As illustrated in FIG. 9, at an ideal pipelined analog-to-digital conversion operation, a digital code may be distributed from 0 to $2^M-1$. But, in case of a non-ideal pipelined analog-to-digital conversion operation, a distribution region may differentiate.

Figure 10:
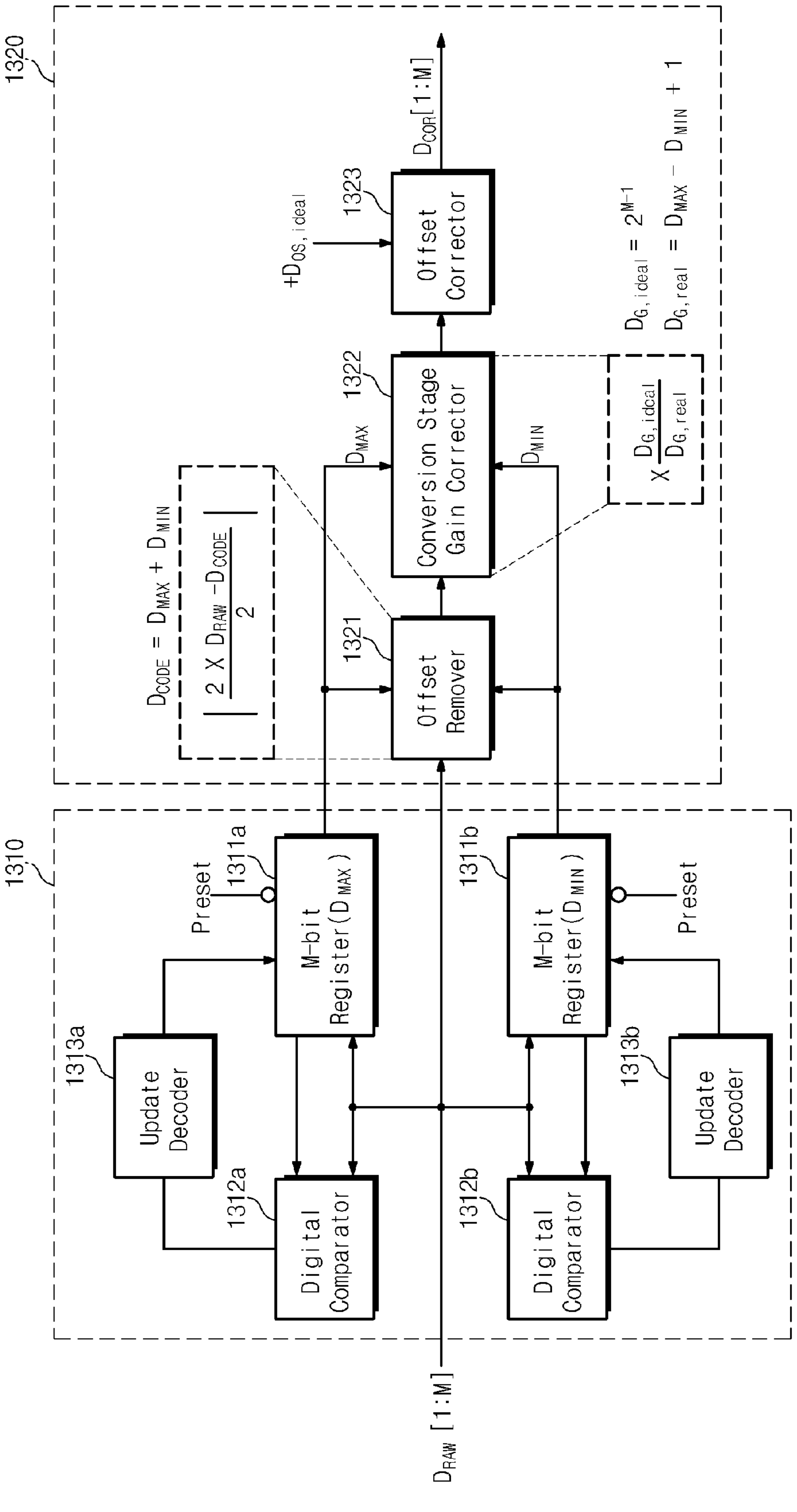
FIG. 10 is a block diagram illustrating a pipelined conversion stage error measuring and correcting circuit in FIG. 1 according to an exemplary embodiment of the inventive concept.

FIG. 10 is a block diagram illustrating a pipelined conversion stage error measuring and correcting circuit in FIG. 1 according to an exemplary embodiment of the inventive concept. Referring to FIG. 10, a pipelined conversion stage error measuring and correcting circuit 1300 may include a conversion stage error measuring circuit 1310 and a conversion stage error correcting circuit 1320.

The conversion stage error measuring circuit 1310 may include the first and second M-bit registers 1311*a* and 1311*b*, the first and second digital comparators 1312*a* and 1312*b*, and the first and second update decoders 1313*a* and 1313*b*.

An M-bit digital code $D_{RAW}[1:M]$ output from the first digital correction circuit 1200 in FIG. 1 may be continuously provided to the conversion stage error measuring circuit 1310.

The first M-bit register 1311*a* may store a maximum value $D_{MAX}$ of the continuously input digital codes $D_{RAW}[1:M]$. The first M-bit register 1311*b* may store a minimum value $D_{MIN}$ of the continuously input digital codes $D_{RAW}[1:M]$. The first M-bit registers 1311*a* and 1131*b* may be configured the same as each other. The first M-bit registers 1311*a* and 1131*b* may be reset in response to a preset signal Preset.

The first digital comparator 1312*a* may compare the input digital codes $D_{RAW}[1:M]$ with the maximum value $D_{MAX}$ stored in the first M-bit register 1311*a* to generate the first update signal according to a comparison result. The second digital comparator 1312*b* may compare the input digital codes $D_{RAW}[1:M]$ with the minimum value $D_{MIN}$ stored in the second M-bit register 1311*b* to generate the second update signal according to a comparison result.

The first update decoder 1313*a* may update the maximum value $D_{mAx}$ stored in the first M-bit register 1311*a* with the input digital codes $D_{RAW}[1:M]$ in response to the first update signal from the first digital comparator 1312*a*. The second update decoder 1313*b* may update the minimum value $D_{MIN}$ stored in the second M-bit register 1311*b* with the input digital codes $D_{RAW}[1:M]$ in response to the second update signal from the second digital comparator 1312*b*.

The conversion stage error correcting circuit 1320 may make error correction based upon information $D_{MAX}$ and $D_{MIN}$ measured by the conversion stage error measuring circuit 1310. The conversion stage error correcting circuit 1320 may include an offset remover 1321, a conversion stage corrector 1322, and an offset corrector 1323.

The offset remover 1321 may remove a measured offset digital code from the digital code $D_{RAW}$.

In an ideal case, an offset digital code of the digital code $D_{RAW}$ may be expressed by the following equation 1.

$$D_{OS,ideal}=[2^{M-2}]\text{decimal} \quad (1)$$

An offset digital code of the digital code $D_{RAW}$ measured by the conversion stage error measuring circuit 1310 may be expressed by the following equation 2.

$$D_{OS,ideal}=[D_{CODE}/2]\text{decimal}=[D_{MAX}-D_{MIN}/2]\text{decimal} \quad (2)$$

In an ideal case, a distribution of a digital code $D_{RAW}$ of a residual voltage $V_{RES}$ of a conversion stage 1110 in FIG. 1 may have $(2^M-1)$ periods $D_{G,ideal}$. However, a distribution of a residual voltage code $D_{RAW}$ measured by the conversion stage error measuring circuit 1310 may be defined by $(D_{MAX}-D_{MIN}+1)$ real measurement periods $D_{G,real}$.

The conversion stage gain corrector 1322 may correct a conversion stage error by multiplying an output value of the offset remover 1321 with a value expressed by the following equation 3.

$$[D_{G,ideal}/D_{G,real}]\text{decimal}=[2^{M-1}/D_{MAX}-D_{MIN}+1]\text{decimal} \quad (3)$$

The offset corrector 1323 may add an ideal offset digital code $D_{G,ideal}$ to conversion stage gain-corrected data instead of a measured offset removed for conversion stage gain correction.

As described above, the conversion stage error correcting circuit 1320 may correct a conversion stage error of the conversion stage 1110 in FIG. 1 and may output an M-bit digital code $D_{COR}[1:M]$.

Figure 11:
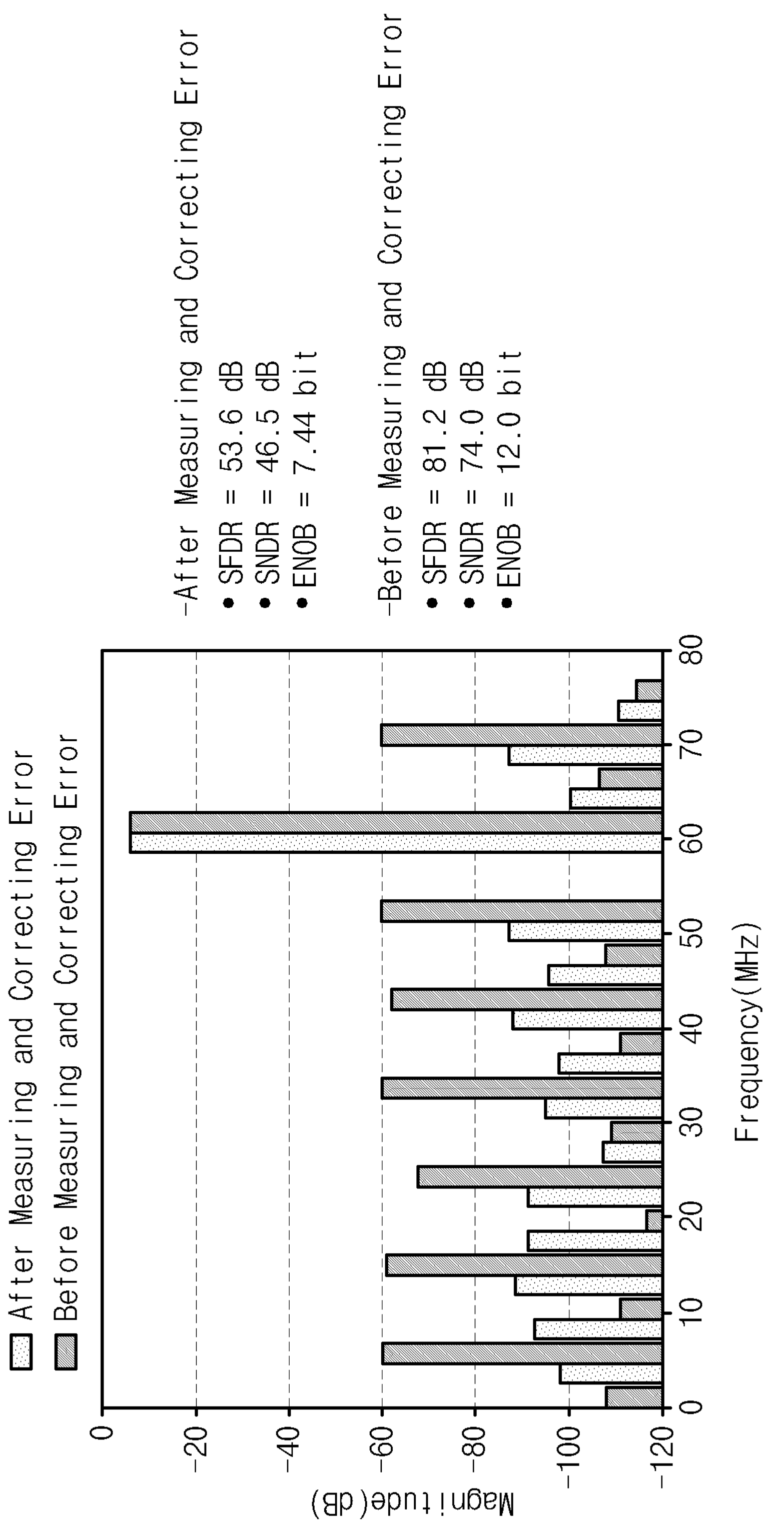
FIG. 11 is a diagram for describing a simulation result of a pipelined analog-to-digital converter according to an exemplary embodiment of the inventive concept.

FIG. 11 is a diagram for describing a simulation result of a pipelined analog-to-digital converter according to an exemplary embodiment of the inventive concept. In FIG. 11, there is exemplarily illustrated a simulation result of an analog-digital converter of a pipelined 12-bit resolution which includes 6 conversion stages and uses a 3-bit analog-to-digital sub-converter. Typically, a pipelined structure configured to convert 3-bit digital data every conversion stage may adopt a 6-conversion stage structure by overlapping a 1-bit digital conversion region. As illustrated in FIG. 11, FFT waveforms may differentiate before and after a conversion stage error correcting manner is applied. When a conversion stage error correcting manner is applied, the effective number of bit (ENOB) can be bettered from 7.44 bits to 12 bits as compared with the case that a conversion stage error correcting manner is not applied.

As described above, a pipelined analog-to-digital converter 1000 according to an exemplary embodiment of the inventive concept may solve an error problem caused at a pipeline conversion stage. Since an inter-chip difference is corrected independently, a yield may be improved. Further, it is possible to reduce an error due to device mismatch, power consumption of an intellectual property, and a chip area.

A digital conversion method of a pipelined analog-to-digital converter according to an exemplary embodiment of the inventive concept may include measuring an error of an upper conversion part having a conversion stage whose error is to be measured; correcting at least one digital code output from a lower conversion part using the measured error, the lower conversion part including at least one conversion stage connected in series with the upper conversion part; and receiving a digital code output from the upper conversion part and the at least one corrected digital code to make data correction.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A pipelined analog-to-digital converter comprising:
- a conversion stage part including K conversion stages (K being an integer of 2 or more) connected in series, each of the K conversion stages being configured to convert an input voltage into a B-bit digital code (B being a natural number) in response to a plurality of clock signals and to output a residual voltage, the K conversion stages being divided into an upper conversion part having a conversion stage being an error-measured object and a lower conversion part having at least one conversion stage connected in series with the upper conversion part;
- a first digital correction circuit configured to receive at least one digital code from the lower conversion part and to perform a data correction operation;
- a pipelined conversion stage error measuring and correcting circuit configured to measure an error of the upper conversion part and to correct an output value from the first digital correction circuit using the measured error; and
- a second digital correction circuit configured to receive at least one digital code from the upper conversion part and an output value of the pipelined conversion stage error measuring and correcting circuit and to perform a data correction operation.

2. The pipelined analog-to-digital converter of claim 1, wherein each of the K conversion stages comprises:
- a multiplying digital-to-analog converter configured to convert a $(2^B-1)$-bit digital code into an analog signal in response to the plurality of clock signals and to output the residual voltage by subtracting the converted analog signal from the input voltage; and
- an analog-to-digital sub-converter configured to convert the input voltage into the $(2^B-1)$-bit digital code and the B-bit digital code.

3. The pipelined analog-to-digital converter of claim 2, wherein the multiplying digital-to-analog converter comprises:
- a sampler configured to sample the input voltage in response to a first clock signal of the plurality of clock signals;
- a digital-to-analog converter configured to convert the $(2^B-1)$-bit digital code into an analog signal in response to a second clock signal of the plurality of clock signals;
- a subtracter configured to subtract an output value of the digital-to-analog converter from an output of the sampler; and
- a residual voltage amplifier configured to output the residual voltage by amplifying an output value of the subtracter in response to the second clock signal.

4. The pipelined analog-to-digital converter of claim 2, wherein the analog-to-digital sub-converter comprises:

a sampler configured to sample the input voltage in response to a first clock signal of the plurality of clock signals;

a preprocessing amplifier string configured to amplify an output value of the sampler;

a latch string configured to latch an output value of the preprocessing amplifier string in response to a second clock signal of the plurality of clock signals and to output the $(2^B-1)$-bit digital code; and a decoder configured to decode an output value of the latch string into the B-bit digital code.

5. The pipelined analog-to-digital converter of claim 2, wherein the multiplying digital-to-analog converter comprises:

an operational amplifier configured to output the residual voltage;

at least one first switch configured to sample an input signal in response to a first clock signal of the plurality of clock signals and a clock signal having a changed phase of the first clock signal, to convert the $(2^B-1)$-bit digital code from the analog-to-digital sub-converter into an analog signal in response to a second clock signal of the plurality of clock signals, and to output the converted analog signal to an input terminal of the operational amplifier; and at least one second switch configured to sample the input signal in response to the first clock signal and the clock signal having a changed phase of the first clock signal and to connect the input terminal and an output terminal of the operation amplifier in response to the second clock signal.

6. The pipelined analog-to-digital converter of claim 5, wherein the first and second clock signals are complementary.

7. The pipelined analog-to-digital converter of claim 1, wherein the pipelined conversion stage error measuring and correcting circuit comprises:

a conversion stage error measuring circuit configured to measure an offset and a gain of a first one of the K conversion stages; and a conversion stage error correcting circuit configured to correct an output value of the first digital correction circuit using the measured offset and gain.

8. The pipelined analog-to-digital converter of claim 7, wherein the conversion stage error measuring circuit comprises:

a first register;

a second register;

a first digital comparator configured to compare an output value of the first digital correction circuit with a value stored in the first register;

a second digital comparator configured to compare the output value of the first digital correction circuit with a value stored in the second register;

a first update decoder configured to update the value stored in the first register with the output value of the first digital correction circuit when a comparison result of the first digital comparator indicates that the output value of the first digital correction circuit is larger than the value stored in the first register; and a second update decoder configured to update the value stored in the second register with the output value of the first digital correction circuit when a comparison result of the second digital comparator indicates that the output value of the second digital correction circuit is smaller than the value stored in the second register.

9. The pipelined analog-to-digital converter of claim 8, wherein the first and second registers are reset in response to a preset signal.

10. The pipelined analog-to-digital converter of claim 8, wherein the conversion stage error correcting circuit comprises:

an offset remover configured to remove the offset in response to values stored in the first and second registers;

a conversion stage gain corrector configured to correct the gain in response to the values stored in the first and second registers and an output value of the offset remover; and an offset corrector configured to correct the offset in response to an output value of the conversion stage gain corrector.

11. The pipelined analog-to-digital converter of claim 8, wherein the offset remover outputs an offset of:

$$|(2\times D_{RAW}-D_{CODE})/2|,$$

wherein $D_{RAW}$ is an output value of the first digital correction circuit, $D_{CODE}$ is a sum of a value stored in the first register and a value stored in the second register.

12. The pipelined analog-to-digital converter of claim 11, wherein the conversion stage gain corrector multiplies an output value of the offset remover with a value of:

$$[D_{G,ideal}/D_{G,real}]=[2^{M-1}/(D_{MAX}-D_{MIN}+1)],$$

wherein $D_{G,ideal}$ indicates an ideal measurement period, $D_{G,real}$ indicates a real measurement period, M indicates the number of digital bits output from the first digital correction circuit, $D_{MAX}$ is a value stored in the first register, and $D_{MIN}$ is a value stored in the second register.

13. The pipelined analog-to-digital converter of claim 12, wherein the offset corrector adds an output value of the conversion stage gain corrector and a value of:

$$D_{OS,ideal}=[2^{M-2}],$$

wherein $D_{OS,idea}$ is an ideal offset digital code value.

14. The pipelined analog-to-digital converter of claim 1, further comprising:

a clock signal generator configured to generate the plurality of clock signals.

15. The pipelined analog-to-digital converter of claim 1, further comprising: a reference voltage buffer configured to generate a reference voltage.

* * * * *